United States Patent
Grabinski

(10) Patent No.: US 9,571,080 B2
(45) Date of Patent: Feb. 14, 2017

(54) DELAY-LOCKED LOOP ARRANGEMENT AND METHOD FOR OPERATING A DELAY-LOCKED LOOP CIRCUIT

(71) Applicant: Synopsys, Inc., Mountain View, CA (US)

(72) Inventor: Jan Grabinski, Gdansk (PL)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 14/817,446

(22) Filed: Aug. 4, 2015

(65) Prior Publication Data

US 2016/0036426 A1      Feb. 4, 2016

(30) Foreign Application Priority Data

Aug. 4, 2014   (EP) .................................... 14179636

(51) Int. Cl.
| | |
|---|---|
| *H03L 7/06* | (2006.01) |
| *H03K 5/135* | (2006.01) |
| *H03L 7/08* | (2006.01) |
| *H03L 7/081* | (2006.01) |
| *H03L 7/10* | (2006.01) |
| *H03K 5/00* | (2006.01) |

(52) U.S. Cl.
CPC ................ *H03K 5/135* (2013.01); *H03L 7/08* (2013.01); *H03L 7/0802* (2013.01); *H03L 7/0812* (2013.01); *H03L 7/10* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 6,741,110 | B2 * | 5/2004 | Roisen ...................... | G06F 1/06 327/149 |
| 7,936,193 | B2 * | 5/2011 | Van Der Wel ............ | H03L 7/07 327/147 |
| 8,432,206 | B2 * | 4/2013 | Yuan ...................... | H03L 7/0812 327/149 |
| 8,704,570 | B2 | 4/2014 | Bottelli et al. | |
| 9,148,154 | B2 | 9/2015 | Choudhary et al. | |
| 9,287,886 | B2 * | 3/2016 | Ciccarelli ............. | H03L 7/1974 |
| 2002/0125926 | A1 | 9/2002 | Schnell | |
| 2007/0152723 | A1 | 7/2007 | Ahn et al. | |
| 2009/0085618 | A1 | 4/2009 | Schneider et al. | |

(Continued)

*Primary Examiner* — Lincoln Donovan
*Assistant Examiner* — Khareem E Almo
(74) *Attorney, Agent, or Firm* — Fenwick & West LLP

(57) ABSTRACT

Delay-locked loop arrangement comprising a steering unit and a delay-locked loop circuit. The steering unit is configured to generate a reference clock signal and a main clock signal wherein the reference clock signal and the main clock signal feature a first frequency during a performance mode of operation. The reference clock signal and the main clock signal feature a second frequency being lower than the first frequency and a phase delay with respect to each other during a sleep mode of operation. The delay-locked loop circuit is configured to generate an error signal depending on a comparison of the reference clock signal and a feedback signal. Furthermore, the delay-locked loop circuit generates the feedback signal depending on the error signal and on the main clock signal.

21 Claims, 2 Drawing Sheets

(56) References Cited

U.S. PATENT DOCUMENTS

| | | | |
|---|---|---|---|
| 2010/0213992 A1* | 8/2010 | Hyun | H03L 7/0814 327/147 |
| 2011/0002181 A1* | 1/2011 | Rhee | G11C 7/02 365/194 |
| 2014/0218083 A1 | 8/2014 | Choudhary et al. | |
| 2015/0244381 A9 | 8/2015 | Choudhary et al. | |

* cited by examiner

DELAY-LOCKED LOOP ARRANGEMENT AND METHOD FOR OPERATING A DELAY-LOCKED LOOP CIRCUIT

CROSS-REFERENCE TO RELATED APPLICATION

This application claims priority under 35 U.S.C. §119(a) to European Patent Application No. 14179636.7 filed on Apr. 4, 2014, which is incorporated by reference herein in its entirety.

BACKGROUND OF THE INVENTION

The invention relates to a delay-locked loop arrangement and to a method for operating a delay-locked loop circuit.

A delay-locked loop circuit is an electronic circuit used to generate multiple output signals, being in particular output clock signals, characterized by the same frequency and phase differences between the individual output signals. To this end a main clock signal is delayed several times and a phase for example of one of the resulting output signals is compared to a phase of a reference clock signal. In this way, phase relations of the output signals are synchronized with respect to the reference clock signal.

In order to save power, it would be desirable to power down the delay-locked loop circuit for example when it is not in use, for example during a stalled mode of operation of an electronic component that is supplied by the delay-locked loop circuit. However, there may be a requirement for a short response time, for example for a response time in the order of several nanoseconds, for the delay-locked loop circuit to get back to a normal operation. This is a major drawback for a solution including powering down the delay-locked loop circuit completely. Furthermore, later errors due to leakage within the delay-locked loop circuit may increase with the time the circuit is powered down.

SUMMARY OF THE INVENTION

According to the improved concept a delay-locked loop arrangement is able to be operated in a performance mode and in a sleep mode of operation. In the sleep mode a reference clock signal is externally delayed and supplied to a delay-locked loop circuit. A main clock signal is supplied to the delay-locked loop circuit and used to generate a feedback signal to be compared with the reference signal.

A delay-locked loop arrangement according to the improved concept comprises a steering unit and a delay-locked loop circuit. The steering unit is configured to generate a reference clock signal and a main clock signal, wherein the reference clock signal and the main clock signal feature a first frequency during a performance mode of operation. The reference clock signal and the main clock signal feature a second frequency being lower than the first frequency and a phase delay with respect to each other during a sleep mode of operation. The delay-locked loop circuit is configured to generate an error signal depending on a comparison of the reference clock signal and a feedback signal. Furthermore, the delay-locked loop circuit generates the feedback signal depending on the error signal and on the main clock signal.

The performance mode of operation in a sense corresponds to a normal operation mode of a delay-locked loop arrangement, where the main clock signal is delayed several times, for example by a delay line, to generate at least one output clock signal. The feedback signal may, for example, correspond to one of the at least one output clock signal and is being fed back, for example to an input of a phase detector comprised by the delay-locked loop circuit that compares the feedback signal to the reference clock signal. Based on the comparison, the error signal is generated for example by a control unit comprised by the delay-locked loop circuit. The control unit, for example, uses the error signal to generate a control signal which is provided to the delay line. Based on the control signal, the delay line may, for example, adjust internal settings such that a closed control loop is formed controlling a phase difference between the reference clock signal and the feedback signal to a target value, for example zero or effectively zero.

The sleep mode of operation serves for power saving during periods when the output clock signals of the delay-locked loop circuit are, for example, not needed.

Since a phase error is desired to be as small as possible, the delay-locked loop circuit may for example not be switched off completely during the sleep mode. Such a phase error may for example origin from internal leakage within the delay-locked loop circuit or from a switching back to the performance mode. Therefore, according to the improved concept, the delay-locked loop circuit is still operated during sleep mode, however with a smaller frequency, namely the second frequency. By introducing the phase delay between the reference clock signal and the main clock signal externally, the phase error may be reduced. During the performance mode of operation the reference clock signal and the main clock signal are preferably synchronous, in particular rising edges and falling edges of the reference clock signal and the main clock signal may coincide.

According to several implementations of the delay-locked loop arrangement the phase delay is determined by a processing time of the delay-locked loop circuit. The processing time of the delay-locked loop circuit may, for example, correspond to a delay between the feedback signal and the main clock signal during the performance mode.

In some implementations of the delay-locked loop arrangement the reference clock signal is delayed during the sleep mode with respect to the main clock signal by a clock period of the first frequency.

In such implementations the feedback signal corresponds, for example, to a version of the main clock signal which is delayed by the delay line by a clock period or an integer multiple of clock periods of the first frequency during performance mode of operation. By delaying the reference clock signal by the clock period of the first frequency during sleep mode it is achieved that during sleep mode the feedback signal and the reference signal are synchronous or are nominally synchronous.

In further implementations of the delay-locked loop arrangement the steering unit is configured to initiate the sleep mode and the performance mode, respectively, depending on a value of an input switch signal, a value of a first switch signal and/or on a value of a second switch signal. The first and the second switch signal may for example be derived from the input switch signal.

The first and the second switch signals may, for example, be provided externally to the steering unit. In particular, the output clock signals are commonly provided to a receiver. The receiver may for example provide the first and the second switch signal to the steering unit.

According to some implementations of the delay-locked loop arrangement, the steering unit comprises a first delay element and a first multiplexer. The first delay element is configured to generate a delayed signal based on a first input signal and on a second input signal. Therein, the first input signal is provided by a first clock generator and the second input signal is provided by a second clock generator. The first multiplexer is configured to provide the reference clock signal to the delay-locked loop circuit based on the delayed signal or on the first input signal depending on the first switch signal and/or on the mode of operation.

The first and the second clock generator may, for example, be comprised by the same external device. The external device may, for example, be a phase-lock loop arrangement. In preferred implementations the first input signal and the second input signal are synchronized, that is they comprise at least rising edges coinciding to each other. In implementations where the first input signal and the second input signal provided by the first and the second clock generator, respectively, are not synchronized, the steering unit may further comprise a synchronization circuit for synchronizing the first input signal and the second input signal.

According to further implementations of the delay-locked loop arrangement the steering unit comprises a second multiplexer that is configured to provide the main clock signal to the delay-locked loop circuit. Thereby, the second multiplexer provides the main clock signal based on the first input signal or on the second input signal depending on the second switch signal and/or on the mode of operation. In particular, the second multiplexer may provide the main clock signal to a delay line of the delay-locked loop circuit based on the first input signal during the performance mode and based on the second input signal during the sleep mode.

According to several implementations of the delay-locked loop arrangement the first delay element is implemented as a D-flip-flop comprising a first clock input for receiving the first input signal, a first data input for receiving the second input signal and a first delay output for supplying the first delayed signal to the first multiplexer.

In such an implementation, the first delay element effectively samples the second input signal triggered for example by a rising edge of the first input signal. If the first input signal and the second input signal are synchronized the first delayed signal effectively corresponds to the second input signal being delayed by one clock period of the first input signal. In alternative implementations, the sampling may be triggered alternatively or in addition by a falling edge of the first input signal or by a state of the first input signal.

According to further implementations of the delay-locked loop arrangement, the steering unit further comprises a second delay element and a third delay element. The second delay element is configured to generate the second switch signal depending on an input switch signal and on the first input signal. The third delay element is configured to generate the first switch signal depending on the second switch signal and on the first input signal.

In some of such implementations the second switch signal is delayed with respect to the first switch signal by a clock period of the first frequency or approximately by the clock period of the first frequency.

In several implementations of the delay-locked loop arrangement the second delay element is implemented as a D-flip-flop with a second data input for receiving the input switch signal, a second clock input for receiving the first input signal and a second delay output supplying the second switch signal to the second multiplexer and to the third delay element. In such implementations, for example the third delay element is implemented as a D-flip-flop comprising a third data input for receiving the second switch signal, a third clock input for receiving the first input signal and a third delay output for supplying the first switch signal to the first multiplexer.

In implementations wherein the steering unit comprises the second and the third delay element, the mode of operation is switched by the switch input signal between the sleep mode and the performance mode. Thereby, the second and the third delay element generate the first and the second switch signal, respectively, being delayed with respect to each other. In particular, for implementations comprising D-flip-flops the first and the second switch signal are for example phase delayed with respect to each other by the clock period of the first frequency. Consequently, the first and the second multiplexer are switched at different times, namely the first multiplexer is switched for example one clock period of the first frequency later than the second multiplexer.

In alternative implementations the first and the second switch signal are both equal to each other and are derived from or equal to the input switch signal.

In further implementations of the delay-locked loop arrangement a rising edge of the first input signal is synchronized with a rising of the second input signal.

According to the improved concept, also a method for operating a delay-locked loop circuit is provided. Therein, the method comprises generating a reference clock signal and a main clock signal, wherein the reference clock signal and the main signal feature a first frequency during a performance mode of operation and feature a second frequency and a phase delay with respect to each other during a sleep mode of operation. The second frequency is lower than the first frequency. Then, the reference clock signal and the main clock signal are provided to the delay-locked loop circuit. An error signal is generated by the delay-locked loop circuit depending on a comparison of the reference clock signal and a feedback signal. The feedback signal is generated depending on the error signal and on the main clock signal.

In several implementations of the method the reference clock signal is delayed with respect to the main clock signal during the sleep mode by a clock period of the first frequency.

Further implementations of the method follow readily from the several implementations and embodiments of the delay-locked loop arrangement described.

According to the improved concept, also a method for designing an electronic circuit is provided. Therein a circuit description representing a delay-locked loop arrangement according to the improved concept and/or a circuit arrangement for carrying out a method according to the improved concept is established. The circuit description may for example be stored on a memory device and/or on a computer. Then, the electronic circuit is designed according to the circuit description by means of a design tool, in particular by means of an Electronic Design Automation tool.

BRIEF DESCRIPTION OF THE DRAWINGS

In the following the invention is explained in detail with the aid of exemplary implementations by reference to the drawings. Components that are functionally identical or have an identical effect may be denoted by identical references. Identical or effectively identical components may be described only with respect to the figure where they occur first, their description is not necessarily repeated in successive figures.

DETAILED DESCRIPTION

Figure 1:
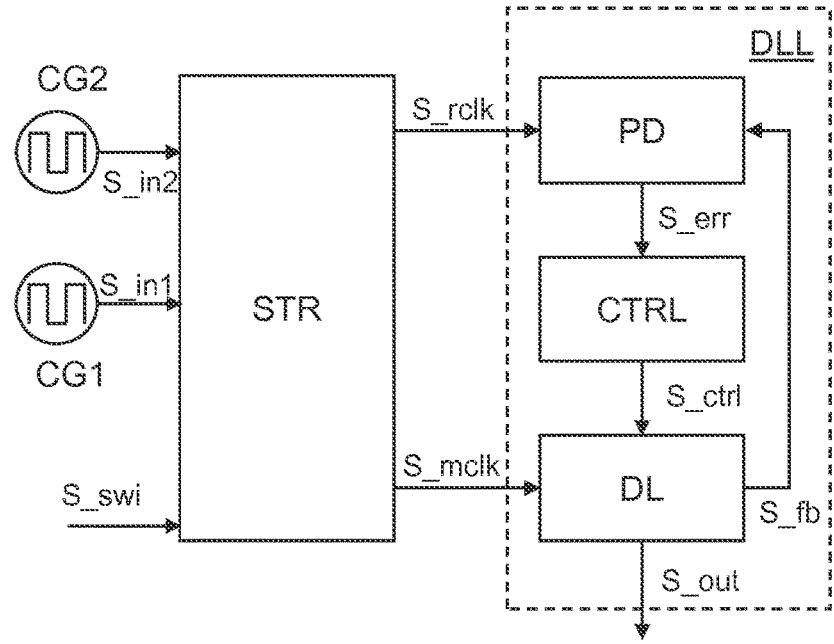
FIG. 1 shows an exemplary implementation of a delay-locked loop arrangement according to the improved concept.

FIG. 1 shows an exemplary implementation of a delay-locked loop arrangement with a steering unit STR that is coupled to a delay-locked loop circuit DLL. In particular, the steering unit STR is coupled to a phase detector PD and to a delay line DL of the delay-locked loop circuit DLL. A control unit CTRL of the delay-locked loop circuit DLL is coupled between the phase detector PD and the delay line DL. Furthermore, the delay line DL is coupled to the phase detector PD. The steering unit STR is coupled to a first clock generator CG1 and to a second clock generator CG2. The first and second clock generators CG1, CG2 may for example be comprised by an external device (not shown), for example by a phase-locked loop arrangement. The delay-locked loop circuit DLL and/or the steering unit STR may for example be coupled to a further external device (not shown).

The first clock generator CG1 provides a first input signal S_in1 to the steering unit STR and the second clock generator CG2 provides a second input signal S_in2 to the steering unit STR. In the shown implementation, the first and the second input signal S_in1, S_in2 are synchronized, that is rising edges of the second input signal S_in2 coincide with rising edges of the first input signal S_in1 (see also FIG. 4). Furthermore, the steering unit STR receives an input switch signal S_swi, for example from the further external device. The steering unit STR provides a reference clock signal S_rclk to the phase detector PD and a main clock signal S_mclk to the delay line DL. The delay line DL provides a feedback signal S_fb to the phase detector PD.

The phase detector PD compares the reference clock signal S_rclk and the feedback signal S_fb, in particular it compares a phase of the reference clock signal S_rclk to a phase of the feedback signal S_fb. Depending on the comparison the phase detector PD generates an error signal S_err and provides it to the control unit CTRL. Based on the error signal S_err the control unit CTRL generates a control signal S_ctrl and provides it to the delay line DL. The delay line DL generates at least one output clock signal S_out by delaying the main clock signal S_mclk. In particular the delay line DL may create several output clock signals S_out by delaying the main clock signal S_mclk several times. To this end, the delay line DL may adjust internal settings, in particular internal settings affecting the delaying, depending on the control signal S_ctrl. The at least one output clock signal S_out may for example be provided to the further external device. Furthermore, the delay line DL generates the feedback signal S_fb based on the main clock signal S_mclk and the control signal S_ctrl. For example, the feedback signal S_fb may be identical to one of the output clock signals S_out. In particular, the feedback signal S_fb may be identical to one of the output clock signals S_out being maximally delayed.

In order to achieve a desired phase offset between the reference clock signal S_rclk and the at least one output clock signal S_out, the feedback signal S_fb is fed back to the phase detector PD to be compared to the reference clock signal S_rclk again. In this way a closed control loop is formed.

According to the improved concept the reference clock signal S_rclk and the main clock signal S_mclk both feature a first frequency during a performance mode of operation and a second frequency during a sleep mode of operation. In particular, the first frequency is equal to a frequency of the first input signal S_in1 and the second frequency is equal to a frequency of the second input signal S_in2, being lower than the first frequency. During the sleep mode the reference clock signal S_rclk and the main clock signal S_mclk feature a phase delay with respect to each other that may for example be determined by a processing time of the delay-locked loop circuit DLL. In particular the phase delay may correspond to a delay of one of the at least one output signal S_out with respect to the main clock signal S_mclk. For example, the reference clock signal S_rclk is delayed with respect to the main clock signal S_mclk by a clock period of the first frequency during the sleep mode.

A switching between the sleep mode and the performance mode may be triggered by the input switch signal S_swi. For example, a logic low state of the input switch signal S_swi may trigger the sleep mode and a logic high value of the input switch signal S_swi may trigger the performance mode or vice versa.

The sleep mode allows for operating the delay-locked loop circuit DLL with a lower power consumption as in the performance mode. For example, an average current for operating the delay-locked loop circuit DLL in the sleep mode may be lower than an average current for operating the delay-locked loop circuit DLL in the performance mode by a factor. The factor may for example lie in the order of several times unity, for example between five and ten, or in the order of tens. At the same time, the sleep mode allows for a short response time when the delay-locked loop circuit DLL is put from the sleep mode back to the performance mode. A requirement for such a response time may, for example, lie in the order of nanoseconds, for example around three nanoseconds.

Figure 2:
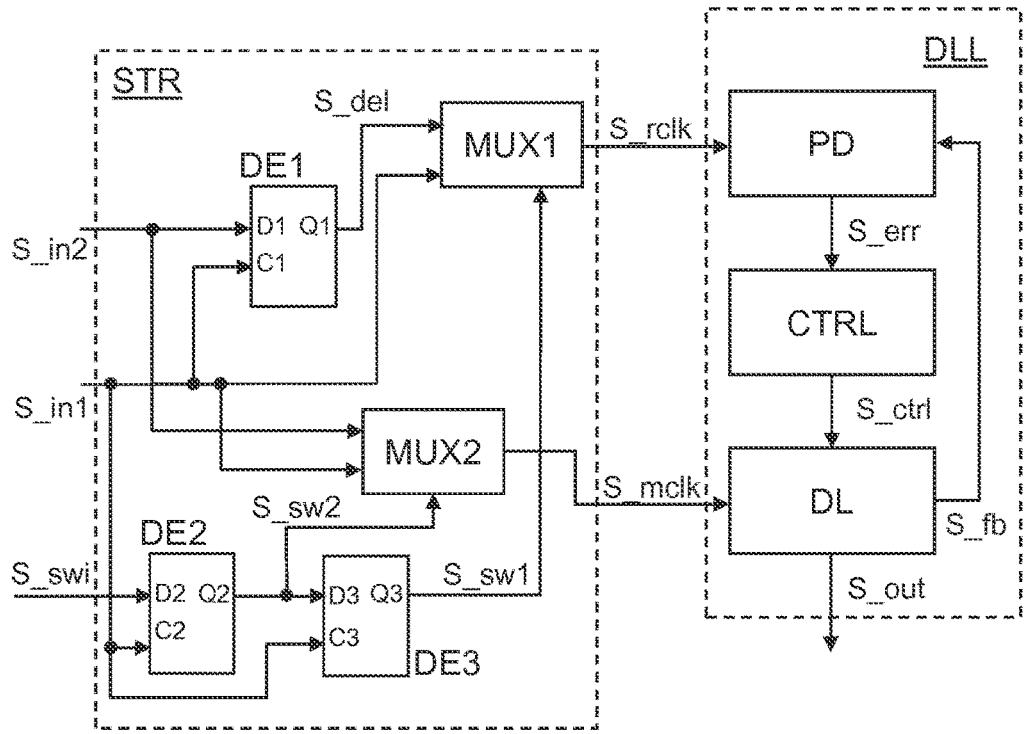
FIG. 2 shows a further exemplary implementation of a delay-locked loop arrangement according to the improved concept.

In FIG. 2, another exemplary implementation of a delay-locked loop according to the improved concept is shown. The shown delay-locked loop arrangement is based on the implementation shown in FIG. 1, but in FIG. 2 the steering unit STR is specified in more detail. In particular the steering unit STR comprises a first delay element DE1, a second delay element DE2 and a third delay element DE3. For example, said delay elements DE1, DE2, DE3 may be implemented as D-flip-flops with data inputs D1, D2, D3, clock inputs C1, C2, C3 and delay outputs Q1, Q2, Q3, respectively. The steering unit STR further comprises a first multiplexer MUX1 and a second multiplexer MUX2.

The first delay element DE1 receives the first input signal S_in1 at the first clock input C1 for example from the first clock generator CG1 and the second input signal S_in2 at the first data input D1 for example from the second clock generator CG2. Based on the first and second input signals S_in1, S_in2, the first delay element DE1 generates a delayed signal S_del at the first delay output Q1 and provides it to the first multiplexer MUX1. The delayed signal S_del is for example generated by sampling the second input signal S_in2 according to rising edges of the first input signal S_in1. This has the effect that the delayed signal S_del features the second frequency as the second input signal S_in2 and is delayed with respect to the second input signal S_in2 by a clock period of the first frequency or of the first input signal S_in1, respectively. Furthermore, the first multiplexer MUX1 receives the first input signal S_in1. The second multiplexer MUX2 receives the first input signal S_in1 and the second input signal S_in2.

The second delay element DE2 receives the first input signal S_in1 at the second clock input C2 for example from the first clock generator CG1 and the input switch signal S_swi at the second data input D2 for example from the further external device. Based on the first input signal S_in1 and the input switch signal S_swi the second delay element DE2 generates a second switch signal S_sw2 at the second delay output Q2 and provides it to the second multiplexer MUX2.

The third delay element DE3 receives the first input signal S_in1 at the third clock input C3 for example from the first clock generator CG1 and the second switch signal S_sw2 at the third data input D3 from the second delay element DE2. Based on the first input signal S_in1 and the second switch signal S_sw2 the third delay element DE3 generates a first switch signal S_sw1 at the third delay output Q3 and provides it to the first multiplexer MUX1.

Such an arrangement of the second and the third delay element DE2, DE3 may for example be denoted by clock domain crossing arrangement. In this way, the first and second multiplexers MUX1, MUX2 recognize a change in the input switch signal S_swi at different times. The first switch signal S_sw1 is for example generated by sampling the second switch signal S_sw2 according to rising edges of the first input signal S_in1. This has the effect that the first switch S_sw1 features the first frequency as the second switch signal S_sw2 and is phase delayed with respect to the second switch signal S_sw2 by a clock period of the first frequency. Such a clock domain crossing arrangement may for example reduce an error arising during a first period of the performance mode.

It is pointed out, however, that the clock domain crossing and the second and third delay elements DE2, DE3 are not obligatory. In alternative implementations without the second and the third delay element DE2, DE3, the first and the second multiplexer MUX1, MUX2 are for example both supplied directly with the input switch signal S_swi replacing the first and second switch signals S_sw1, S_sw2, respectively.

Figure 3:
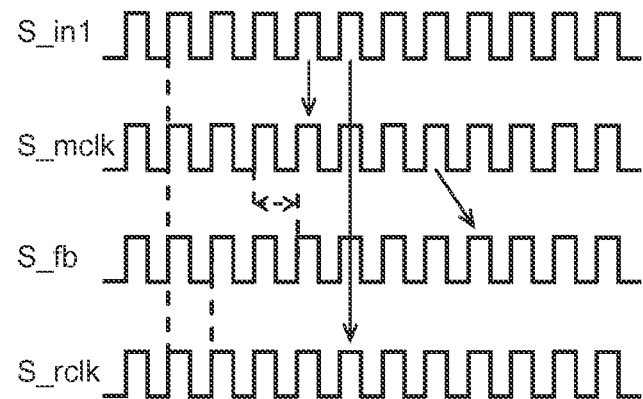
FIG. 3 shows a timing diagram of a delay-locked loop arrangement operating in the performance mode.

FIG. 3 shows an exemplary timing diagram for the first input signal S_in1, the reference clock signal S_rclk, the main clock signal S_mclk and the feedback signal S_fb during the performance mode. Such a timing diagram may correspond to an implementation of the delay-locked loop arrangement for example as discussed with respect to FIGS. 1 and 2.

In the performance mode, the first multiplexer MUX1 and the second multiplexer MUX2 both pass the first input signal S_in1 so that the reference clock signal S_rclk and the main clock signal S_mclk both feature the first frequency and their rising and falling edges are synchronized as indicated by the dashed lines. In the shown example, the delay line DL is for example configured to generate the feedback signal S_fb by delaying the main clock signal S_mclk by one clock period of the first frequency. The delay-locked loop circuit DLL is for example configured to generate the output clock signal S_out such that a phase difference between the reference clock signal S_rclk and the feedback signal S_fb is zero or an integer multiple of $2\pi$, that is effectively zero.

Figure 4:
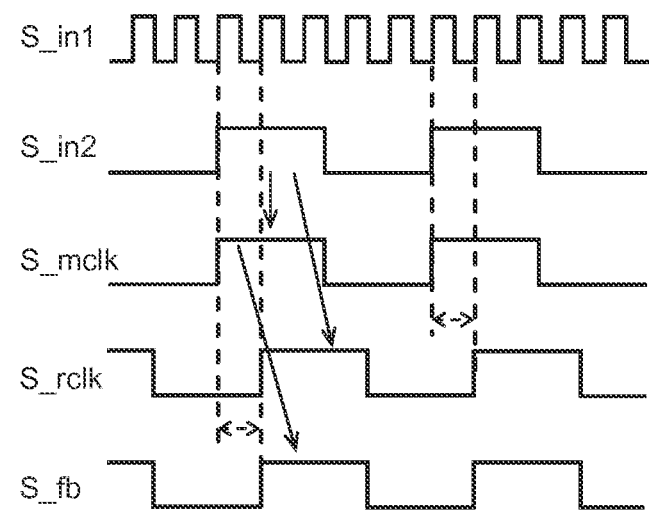
FIG. 4 shows a timing diagram of a delay-locked loop arrangement operating in the sleep mode.

FIG. 4 shows an exemplary timing diagram for the first and the second input signal S_in1, S_in2, the reference clock signal S_rclk, the main clock signal S_mclk and the feedback signal S_fb during the sleep mode. Such a timing diagram may correspond to an implementation of the delay-locked loop arrangement for example as discussed with respect to FIGS. 1 and 2. A respective performance mode is described with respect to FIG. 3.

In the sleep mode, the first multiplexer MUX1 passes the delayed signal S_del and the second multiplexer MUX2 passes the second input signal S_in2 so that the reference clock signal S_rclk and the main clock signal S_mclk both feature the second frequency. The reference clock signal S_rclk is delayed with respect to the main clock signal S_mclk by one clock period of the first frequency. It is highlighted that this delay is carried out by a component external of the delay-locked loop circuit DLL, namely the first delay element DEL The feedback signal S_fb is generated by the delay line by delaying the main clock signal S_mclk by one clock period of the first frequency, that is in the same way as the delay line DL generates the feedback signal S_fb during the performance mode.

Consequently, the feedback signal S_fb and the reference clock signal S_rclk are in phase, just as in the performance mode. In contrast to the external delay of the reference clock signal S_rclk, the delay of the feedback signal S_fb is performed by an internal component of the delay-locked loop circuit DLL, namely the delay line DL.

As before, the delay-locked loop circuit DLL is for example configured to generate the output clock signal S_out such that a phase difference between the reference clock signal S_rclk and the feedback signal S_fb is zero or an integer multiple of $2\pi$, that is effectively zero.

In the described implementations, for example the first and the second input signals are synchronized with respect to their rising edges. Also, the first, second and third delay elements ample the signals at the respective data inputs with respect to rising edges of signals at the respective clock inputs. Clearly, alternatively falling edges of respective signals may be used for synchronization and/or sampling. It is apparent to the skilled reader how to modify the delay-locked loop arrangement and the method accordingly.

By means of the improved concept, it becomes possible to achieve a reduced power and/or current consumption of a delay-locked loop arrangement while maintaining a possibility for a short response time, in particular when switching back from the sleep mode to the performance mode. Additionally, the improved concept allows for low errors due to the sleep mode and/or the switching from the sleep mode to the performance mode and vice versa.

We claim:

1. A delay-locked loop arrangement comprising:
    a delay-locked loop circuit further comprising
        a phase detector configured to compare a reference clock signal to a feedback signal and to generate an error signal depending on said comparison, and
        a delay line configured to generate the feedback signal by delaying a main clock signal depending on the error signal; and
    a steering unit configured to generate the reference clock signal and the main clock signal, wherein the reference clock signal and the main clock signal both feature:
        a first frequency during a performance mode of operation; and
        a second frequency being lower than the first frequency and a phase delay with respect to each other during a sleep mode of operation.

2. The delay-locked loop arrangement according to claim 1, wherein the phase delay is determined by a processing time of the delay-locked loop circuit.

3. The delay-locked loop arrangement according to claim 1, wherein during the sleep mode the reference clock signal is delayed with respect to the main clock signal by a clock period of the first frequency.

4. The delay-locked loop arrangement according to claim 1, wherein the steering unit is configured to initiate the sleep mode and the performance mode, respectively, depending on a value of an input switch signal, a value of a first switch signal and/or on a value of a second switch signal.

5. The delay-locked loop arrangement according to claim 4, wherein the steering unit comprises:
   a first delay element configured to generate a delayed signal based on a first input signal provided by a first clock generator and on a second input signal provided by a second clock generator; and
   a first multiplexer configured to provide the reference clock signal to the delay locked loop circuit based on the delayed signal or on the first input signal depending on the first switch signal.

6. The delay-locked loop arrangement according to claim 5, wherein the steering unit comprises a second multiplexer configured to provide the main clock signal to the delay-locked loop circuit based on the first input signal or on the second input signal depending on the second switch signal.

7. The Delay-locked loop arrangement according to claim 5, wherein the first delay element is implemented as a D-flip-flop, the D-flip-flop comprising:
   a first clock input for receiving the first input signal;
   a first data input for receiving the second input signal; and
   a first delay output for supplying the first delayed signal to the first multiplexer.

8. The delay-locked loop arrangement according to claim 4, wherein the steering unit further comprises:
   a second delay element configured to generate the second switch signal depending on the input switch signal and on the first input signal; and
   a third delay element configured to generate the first switch signal depending on the second switch signal and on the first input signal.

9. The delay-locked loop arrangement according to claim 8, wherein the second switch signal is delayed with respect to the first switch signal by or by approximately a clock period of the first frequency.

10. The delay-locked loop arrangement according to claim 8, wherein the second delay element is implemented as a D-flip-flop, the D-flip-flop comprising:
   a second data input for receiving the input switch signal;
   a second clock input for receiving the first input signal; and
   a second delay output supplying the second switch signal to the second multiplexer; and
   wherein the third delay element is implemented as a D-flip-flop comprises:
   a third data input for receiving the second switch signal;
   a third clock input for receiving the first input signal; and
   a third delay output for supplying the first switch signal to the first multiplexer.

11. The delay-locked loop arrangement according to claim 4, wherein the first and the second switch signal are both equal to each other and are derived from an input switch signal.

12. The delay-locked loop arrangement according to claim 5, wherein a rising edge of the first input signal is synchronized with a rising edge of the second input signal.

13. The delay-locked loop arrangement according to claim 1, wherein the delay-locked loop circuit comprises a phase detector configured to carry out the comparison of the feedback signal and the reference clock signal and to generate the error signal depending on the comparison.

14. The delay-locked loop arrangement according to claim 1, wherein the delay-locked loop circuit comprises a delay line configured to delay the main clock signal for generating the feedback signal depending on the error signal.

15. A method for operating a delay-locked loop circuit, wherein the method comprises:
   generating a reference clock signal and a main clock signal, wherein the reference clock signal and the main clock signal both comprise:
      a first frequency during a performance mode of operation, and
      a second frequency being lower than the first frequency and a phase delay with respect to each other during a sleep mode of operation;
   providing the reference clock signal and the main clock signal to the delay-locked loop circuit;
   generating an error signal depending on a comparison of the reference clock signal and a feedback signal; and
   generating the feedback signal by delaying the main clock signal depending on the error signal.

16. The method according to claim 15, wherein during the sleep mode the reference clock signal is delayed with respect to the main clock signal by a clock period of the first frequency.

17. A method for designing an electronic circuit, wherein the method comprises:
   establishing a circuit description representing a delay-locked loop arrangement, the circuit description comprising:
      a steering unit configured to generate a reference clock signal and a main clock signal, wherein both the reference clock signal and the main clock signal feature:
         a first frequency during a performance mode of operation; and
         a second frequency being lower than the first frequency and a phase delay with respect to each other during a sleep mode of operation; and
      a delay-locked loop circuit configured to:
         generate an error signal depending on a comparison of the reference clock signal and a feedback signal; and
         generate the feedback signal depending on the error signal and on the main clock signal;
   storing the circuit description on a memory device; and
   designing the electronic circuit according to the circuit description by means of a design tool, in particular an Electronic Design Automation tool.

18. The delay-locked loop arrangement according to claim 1, wherein during the performance mode of operation, the main clock signal and the reference clock signal are synchronous.

19. The delay-locked loop arrangement according to claim 1, wherein during the performance mode of operation
   rising edges of the reference clock signal and rising edges the main clock signal coincide; and/or
   falling edges of the reference clock signal and falling edges of the main clock signal coincide.

20. The method according to claim 15, wherein during the performance mode of operation, the main clock signal and the reference clock signal are synchronous.

21. The method according to claim 15, wherein during the performance mode of operation rising edges of the reference clock signal and the main clock signal are synchronized; and/or falling edges of the reference clock signal and the main clock signal are synchronized.

* * * * *